(12) United States Patent
Teich et al.

(10) Patent No.: US 8,240,650 B2
(45) Date of Patent: Aug. 14, 2012

(54) CHUCK WITH TRIAXIAL CONSTRUCTION

(75) Inventors: Michael Teich, Moritzburg OT Friedewald (DE); Karsten Stoll, Sohland an der Spree (DE); Axel Schmidt, Thiendorf OT Stölpchen (DE); Stojan Kanev, Thiendorf OT Sacka (DE); Jörg Kiesewetter, Thiendorf OT Sacka (DE)

(73) Assignee: Cascade Microtech, Inc., Beaverton, OH (US)

( * ) Notice: Subject to any disclaimer, the term of this patent is extended or adjusted under 35 U.S.C. 154(b) by 1133 days.

(21) Appl. No.: 12/048,323

(22) Filed: Mar. 14, 2008

(65) Prior Publication Data

US 2008/0224426 A1 Sep. 18, 2008

(30) Foreign Application Priority Data

Mar. 16, 2007 (DE) .................. 10 2007 013 436

(51) Int. Cl.
*B25B 1/00* (2006.01)
*B23Q 3/00* (2006.01)
*G01R 31/20* (2006.01)
*F28F 7/00* (2006.01)
*B23B 31/30* (2006.01)
*B23B 31/12* (2006.01)

(52) U.S. Cl. ............ 269/309; 269/21; 324/750.24; 324/754.1; 324/754.16; 165/138; 279/3

(58) Field of Classification Search .......... 269/309, 269/21; 324/750.2, 754.1, 754.16; 279/3, 279/137; 165/138
See application file for complete search history.

(56) References Cited

U.S. PATENT DOCUMENTS

| | | | | |
|---|---|---|---|---|
| 5,981,913 A | * | 11/1999 | Kadomura et al. | 219/444.1 |
| 6,132,551 A | * | 10/2000 | Horioka et al. | 156/345.48 |
| 6,256,187 B1 | * | 7/2001 | Matsunaga et al. | 361/234 |
| 6,259,592 B1 | * | 7/2001 | Ono | 361/234 |
| 6,583,638 B2 | * | 6/2003 | Costello et al. | 324/750.09 |
| 6,914,423 B2 | * | 7/2005 | Nordgren et al. | 324/756.01 |
| 6,965,226 B2 | * | 11/2005 | Dunklee | 324/756.01 |
| 7,187,188 B2 | * | 3/2007 | Andrews et al. | 324/750.03 |
| 7,268,533 B2 | * | 9/2007 | Harris et al. | 324/756.01 |
| 7,492,172 B2 | * | 2/2009 | Stewart et al. | 324/756.02 |
| 7,619,870 B2 | * | 11/2009 | Himori et al. | 361/234 |
| 2002/0066551 A1 | * | 6/2002 | Stone et al. | 165/138 |
| 2008/0042374 A1 | * | 2/2008 | Dunklee | 279/3 |
| 2008/0042376 A1 | * | 2/2008 | Nordgren et al. | 279/137 |
| 2008/0042642 A1 | * | 2/2008 | Dunklee | 324/158.1 |
| 2008/0042669 A1 | * | 2/2008 | Nordgren et al. | 324/754 |
| 2008/0054884 A1 | * | 3/2008 | Dunklee | 324/158.1 |

\* cited by examiner

*Primary Examiner* — Lee D Wilson
*Assistant Examiner* — Alvin Grant
(74) *Attorney, Agent, or Firm* — DASCENZO Intellectual Property Law, P.C.

(57) ABSTRACT

A chuck with triaxial construction comprises a receiving surface for a test substrate and arranged below the receiving surface: an electrically conductive first surface element, an electrically conductive second surface element electrically insulated therefrom, and an electrically conductive third surface element electrically insulated therefrom, and, between the first and the second surface element, a first insulation element and, between the second and the third surface element, a second insulation element. A chuck for very low current measurements which can be used to prevent the occurrence of leakage currents and a triboelectric charge and which is configured favourably in terms of production, is achieved because at least one of the electrically conductive surface elements is mechanically connected to at least one insulation element and has an elasticity that compensates for an expansion difference resulting from differences in different coefficients of expansion between a respective surface element and an adjoining insulation element.

16 Claims, 1 Drawing Sheet

CHUCK WITH TRIAXIAL CONSTRUCTION

CROSS REFERENCE TO RELATED APPLICATIONS

Figure 1:
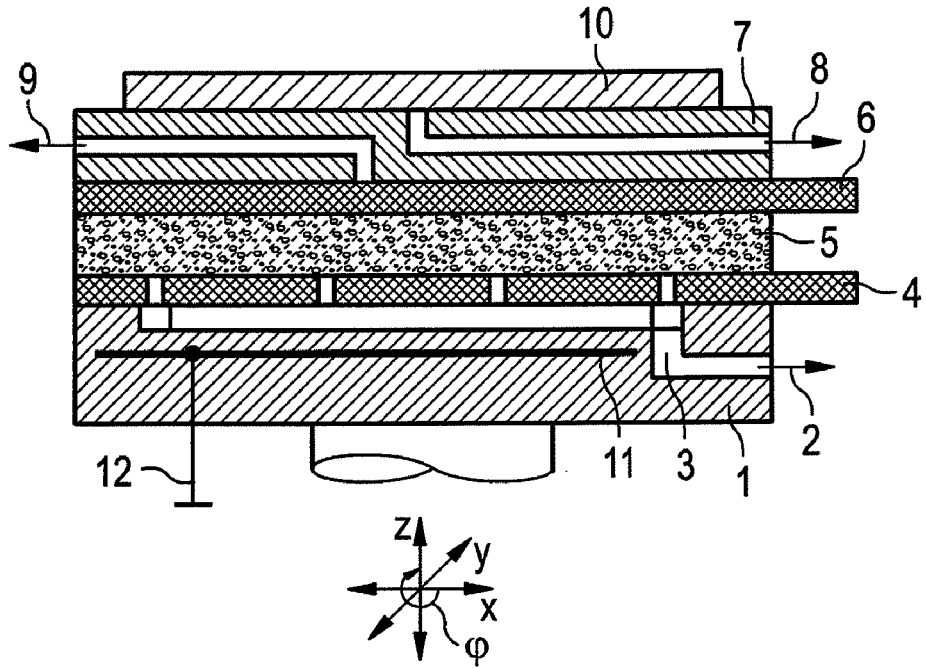

This application claims priority of German application No. 10 2007 013 436.5 filed on Mar. 16, 2007, the entire disclosure of which is hereby incorporated herein by reference.

BACKGROUND ART

The invention relates to a chuck with triaxial construction comprising a receiving surface for a test substrate wherein there is arranged below the receiving surface an electrically conductive first surface element (force), an electrically conductive second surface element (guard) electrically insulated therefrom, and an electrically conductive third surface element (shield) electrically insulated therefrom, and, between the first and the second surface element, a first insulation element and, between the second and the third surface element, a second insulation element.

For testing semiconductor chips or similar substrates, needles are used to make contact with contact islands on the substrate surface and said contact islands are electrically connected via said needles to test devices used to measure the properties of the substrates. So-called probers having a clamping table for fixedly holding the substrates, a so-called chuck, are used for this purpose. Such a chuck is usually also provided with vacuum clamping means for fixedly holding the substrates on the substrate surface.

During testing it may also become necessary to carry out very low current measurements. Since, during these very low current measurements, tiny leakage currents lead to a corruption of the measurement result, the components that are at least indirectly connected with the measuring operation, such as lines, the chuck or the like, are provided with a triaxial construction. This means that the components which are at measurement potential (force) not only have a shield which is connected to earth or is embodied in floating fashion, rather an additional shield, a so-called guard, to which is applied a potential which at least approximately corresponds to the force potential that is decoupled from the latter, is also arranged between force and shield.

Accordingly, for very low current measurements, the chuck, too, is constructed in triaxial fashion. It has a top side, on which the substrate bears and to which force potential is applied. The guard extends below the top side, said guard being isolated from the top side by an insulating layer. The shield is then situated below the guard—likewise in a manner electrically insulated from the guard.

This construction can be realized in the form of differently conductive layering of a ceramic chuck. AlN, for example, is suitable for this as ceramic material. It is found here that the contact made with these layers externally is poor. This also applies to layers or interlayers applied by sputtering or paper deposition.

Moreover, in this case the required insulation resistance often cannot be achieved. Other ceramic materials having a sufficient insulation resistance, such as BN (boron nitride), for example, in turn cannot be provided with conductive layers or can only be poorly provided with conductive layers.

It is also possible to realize a triaxial construction by means of metal plates insulated from one another. In the case of chucks constructed in this way, the thermal mass is unnecessarily high. Moreover, difficulties occur in producing a basic flatness and maintaining this flatness under thermal loading.

In all solutions, besides the effectiveness of the triaxial construction, it is also necessary to avoid an adverse influence of the triboelectric effect. In this case, friction between layers having different dielectric constants, for example metal and ceramic, as a result of a triboelectricity generates a charge that can ultimately corrupt the measurement result.

BRIEF SUMMARY OF INVENTION

The object of the invention is therefore to specify a chuck for very low current measurements which can be used to prevent the occurrence of leakage currents and a triboelectric charge and which is configured favourably in terms of production.

This object is achieved by means of a chuck comprising the features of the claimed elements and configurations thereof.

BRIEF DESCRIPTION OF THE DRAWING FIGURES

The invention will be explained in more detail below on the basis of two exemplary embodiments. In the associated drawings FIG. 1 shows a chuck according to the invention with a third surface element inserted in the thermochuck, and FIG. 2 shows a chuck according to the invention with three surface elements stacked one above another.

DETAILED DESCRIPTION

Figure 2:
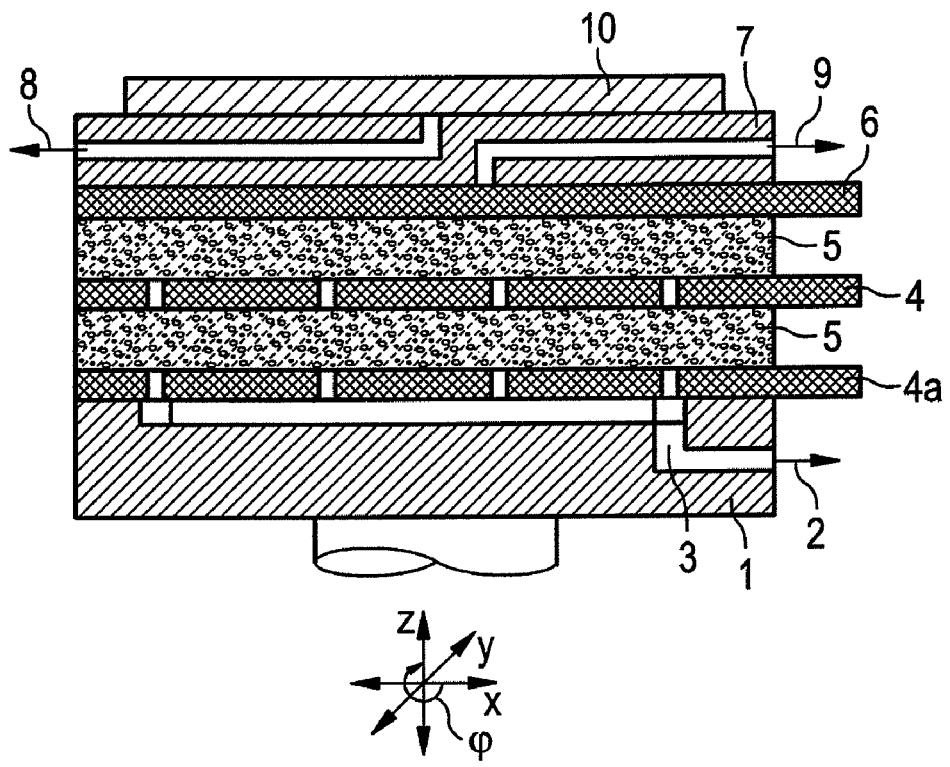

As illustrated in FIG. 1, a second surface element in the form of a perforated conductor film 4 is placed onto a baseplate in the form of a thermochuck 1 and is connected to guard potential. The third surface element (shield) is arranged in the form of a shielding layer 11 in the thermochuck 1 and has measurement ground potential 12 applied to it. In this respect the thermochuck 1 acts as a second insulation element between the third surface element and the second surface element.

Arranged within the thermochuck 1 is a vacuum distribution 3, to which chuck vacuum 2 is permanently applied, whereby the conductor film 4 is sucked up and held. Said vacuum continues in the first insulation element in the form of a porous insulation ceramic 5 and therefore also sucks up the first surface element, which is formed in the form of a non-perforated conductor film 6 contact-connected to force, and fixedly holds it.

A metal plate 7 for holding the substrate 10 is arranged on said conductor film 6. Said metal plate 7 is held on the one hand by a dedicated switchable metal plate vacuum 9 on the metal film 4 and on the other hand is provided with a substrate vacuum 8 for holding the substrate 10, which is independently switchable.

In FIG. 2, the third surface element is formed as a perforated conductor film 4a, which is connected to measurement ground 12 and above which is arranged the second insulation element in the form of a porous insulation ceramic 5. Here the chuck vacuum continues via the conductor film 4a, the second insulation element—situated above the latter—in the form of the insulation ceramic 5, the conductor film 4 and the first insulation element—situated above the latter—in the form of the insulation ceramic 5 as far as the conductor film 6. All the conductor films are therefore held by wringing. By virtue of their thickness (5 to 10 μm) and the possible choice of material, they have an elasticity such that they take up expansions of the insulation ceramic on account of the connecting force and, consequently, movements of the individual elements with respect to one another and hence a triboelectric effect are avoided.

The contact-connections of the individual films can be effected by means of soldering, clamping or laser welding.

The use of the films means that very small thickness tolerances, very low parallelism and planar tolerances and very small thermal masses are obtained.

Besides the standpoint of elasticity, the materials of the films can also be selected with regard to chemical compatibility or thermal loadability. Materials such as gold, nickel, aluminium, copper and the like can be used here.

Boron nitride is suitable for example as insulation ceramic 5.

The invention claimed is:

1. A chuck with triaxial construction, the chuck comprising:
   a receiving surface that is configured to receive a test substrate;
   a first surface element, wherein the first surface element is electrically conductive;
   a second surface element, wherein the second surface element is electrically conductive and is separated from the receiving surface by the first surface element;
   a third surface element, wherein the third surface element is electrically conductive and is separated from the first surface element by the second surface element;
   a first insulation element, wherein the first insulation element is located between and electrically isolates the first surface element and the second surface element;
   a second insulation element, wherein at least one of the surface elements is held in contact with at least one insulation element by vacuum and has an elasticity that compensates for an expansion difference resulting from differences in different coefficients of thermal expansion between a respective surface element and an adjoining insulation element; and
   an electrically insulating baseplate that includes the second insulation element, wherein the electrically insulating baseplate includes a vacuum clamping opening that is configured to be connected to a vacuum source, wherein the third surface element is included in the baseplate, and further wherein the second surface element is placed onto a top side of the baseplate and is configured to be fixed to the baseplate by a vacuum that is applied to the vacuum clamping opening.

2. Chuck according to claim 1, wherein at least one of the first surface element, the second surface element, and the third surface element comprises a film.

3. Chuck according to claim 2, wherein the film has a thickness of 5 to 10 μm.

4. Chuck according to claim 1, wherein the second surface element is provided with a plurality of through openings, wherein the first insulation element is composed of a porous insulation material, and further wherein the second surface element is located on a top side of the second insulation element and configured to be fixed within the chuck by the vacuum.

5. Chuck according to claim 4, wherein the second surface element comprises a perforated film.

6. Chuck according to claim 1, wherein at least one of the first, insulation element and the second insulation element comprises a ceramic.

7. Chuck according to claim 6, wherein the ceramic comprises boron nitride.

8. Chuck according to claim 1, further comprising an electrically insulating baseplate that includes a vacuum clamping opening that is configured to be connected to a vacuum source, wherein the third surface element is located on a top side of the baseplate and is configured to be fixed to the baseplate by a vacuum that is applied to the vacuum clamping opening.

9. Chuck according to claim 8, wherein the third surface element is provided with a first plurality of through openings, wherein the second insulation element is composed of a first porous insulation material, and further wherein the second surface element is located on a top side of the second insulation element and configured to be fixed within the chuck by the vacuum.

10. Chuck according to claim 9, wherein the second surface element is provided with a second plurality of through openings, wherein the first insulation element is composed of a second porous insulation material, and further wherein the first surface element is located on a top surface of the first insulation element and configured to be fixed within the chuck by the vacuum.

11. Chuck according to claim 10, wherein at least one of the third surface element and the second surface element comprises a perforated film.

12. Chuck according to claim 8, wherein the baseplate is formed as an independent thermochuck.

13. Chuck according to claim 1, wherein an exposed surface of the first surface element defines the receiving surface.

14. Chuck according to claim 1, wherein a top side of the first surface element is provided with a metal plate, and further wherein a top side of the metal plate defines the receiving surface.

15. Chuck according to claim 14, wherein the metal plate includes a first vacuum clamping opening that is configured to affix the test substrate to the metal plate when a vacuum is applied thereto, and further wherein the metal plate includes a second vacuum clamping opening that is configured to affix the metal plate to the first surface element when a vacuum is applied thereto.

16. Chuck according to claim 14, wherein the first surface element is provided with a plurality of through openings.

* * * * *

UNITED STATES PATENT AND TRADEMARK OFFICE
CERTIFICATE OF CORRECTION

PATENT NO. : 8,240,650 B2  
APPLICATION NO. : 12/048323  
DATED : August 14, 2012  
INVENTOR(S) : Michael Teich et al.

Page 1 of 1

It is certified that error appears in the above-identified patent and that said Letters Patent is hereby corrected as shown below:

On the Title Page, after "Item (73) Assignee: Cascade Microtech, Inc., Beaverton," and before "(US)" please delete "OH" and insert --OR--

On the Title Page, after section (65) Prior Publication Data, and before section (51) Int. Cl., please delete the following:

"Mar. 16, 2007   (DE) ..................10 2007 013 436"

and insert the following:

--Mar. 16, 2007   (DE) ..................10 2007 013 436.5--

Column 4, line 8, after "first" and before "insulation" please delete ","

Signed and Sealed this
Twenty-third Day of October, 2012

David J. Kappos
*Director of the United States Patent and Trademark Office*